United States Patent
Watanabe et al.

(10) Patent No.: US 11,339,881 B2
(45) Date of Patent: May 24, 2022

(54) VALVE DEVICE AND FLUID CONTROL DEVICE

(71) Applicant: FUJIKIN INCORPORATED, Osaka (JP)

(72) Inventors: Kazunari Watanabe, Osaka (JP); Kohei Shigyou, Osaka (JP); Yohei Sawada, Osaka (JP); Tomohiro Nakata, Osaka (JP); Tsutomu Shinohara, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 0 days.

(21) Appl. No.: 16/966,270

(22) PCT Filed: Feb. 19, 2019

(86) PCT No.: PCT/JP2019/005980
§ 371 (c)(1),
(2) Date: Jul. 30, 2020

(87) PCT Pub. No.: WO2019/167711
PCT Pub. Date: Sep. 6, 2019

(65) Prior Publication Data
US 2020/0370664 A1 Nov. 26, 2020

(30) Foreign Application Priority Data
Feb. 28, 2018 (JP) .............................. JP2018-035927

(51) Int. Cl.
*F16K 7/16* (2006.01)
*F16K 27/02* (2006.01)
(Continued)

(52) U.S. Cl.
CPC .......... *F16K 7/16* (2013.01); *C23C 16/45544* (2013.01); *F16K 27/0236* (2013.01); *H01L 21/67017* (2013.01)

(58) Field of Classification Search
CPC .......... F16K 7/16; F16K 7/17; F16K 27/0236; F16K 31/0672; F16K 31/0641;
(Continued)

(56) References Cited

U.S. PATENT DOCUMENTS

| 4,867,201 A | 9/1989 | Carten |
| 5,002,086 A * | 3/1991 | Linder ................ F16K 17/0453 137/312 |
| 5,829,472 A | 11/1998 | Greenwood et al. |
| 6,196,523 B1 * | 3/2001 | Miyata .................... F16K 1/302 251/264 |

(Continued)

FOREIGN PATENT DOCUMENTS

| GB | 717859 A * | 11/1954 | ............... F16K 7/16 |
| GB | 1503533 A * | 3/1978 | ............... F16K 7/16 |

(Continued)

OTHER PUBLICATIONS

International Search Report issued in Patent Application No. PCT/JP2019/005980, dated May 21, 2019 and English language translation.

*Primary Examiner* — Hailey K. Do
(74) *Attorney, Agent, or Firm* — Greenblum & Bernstein, P.L.C.

(57) ABSTRACT

Provided is a valve device in which influence of a physical impact on a valve element is further reduced. Valve device includes a valve seat disposed around an opening connected to a flow path formed in a valve body, a diaphragm for opening and closing flow path by moving between a contact position and a non-contact position with respect to the valve seat, a presser adapter that contacts a peripheral portion of the diaphragm, a casing that incorporates an actuator for actuating the diaphragm and is fixed on the valve body by being screwed into a screw hole formed in the valve body, (Continued)

and an adapter fixing ring that is screwed into the screw hole and thereby fixed in the valve body while pressing the presser adapter and the diaphragm.

7 Claims, 8 Drawing Sheets

(51) Int. Cl.
*C23C 16/455* (2006.01)
*H01L 21/67* (2006.01)

(58) Field of Classification Search
CPC .. F16K 31/122; F16K 31/126; F16K 31/1266; Y10T 137/87885; C23C 16/45544; H01L 21/67017
See application file for complete search history.

(56) References Cited

U.S. PATENT DOCUMENTS

| | | | |
|---|---|---|---|
| 2006/0060813 A1* | 3/2006 | Iwabuchi | F16K 7/16 251/331 |
| 2010/0127196 A1 | 5/2010 | Sawada et al. | |
| 2016/0047483 A1* | 2/2016 | Hirose | F16K 27/0236 137/602 |
| 2016/0369903 A1 | 12/2016 | Kitano et al. | |
| 2019/0264326 A1* | 8/2019 | Doya | C23C 16/45544 |

FOREIGN PATENT DOCUMENTS

| | | |
|---|---|---|
| JP | 1-133578 U | 9/1989 |
| JP | 6-241329 A | 8/1994 |
| JP | 2005149075 A | 6/2005 |
| JP | 2008-249002 A | 10/2008 |
| JP | 2015-124851 A | 7/2015 |
| JP | 2015-175502 A | 10/2015 |

* cited by examiner

[fig.1]
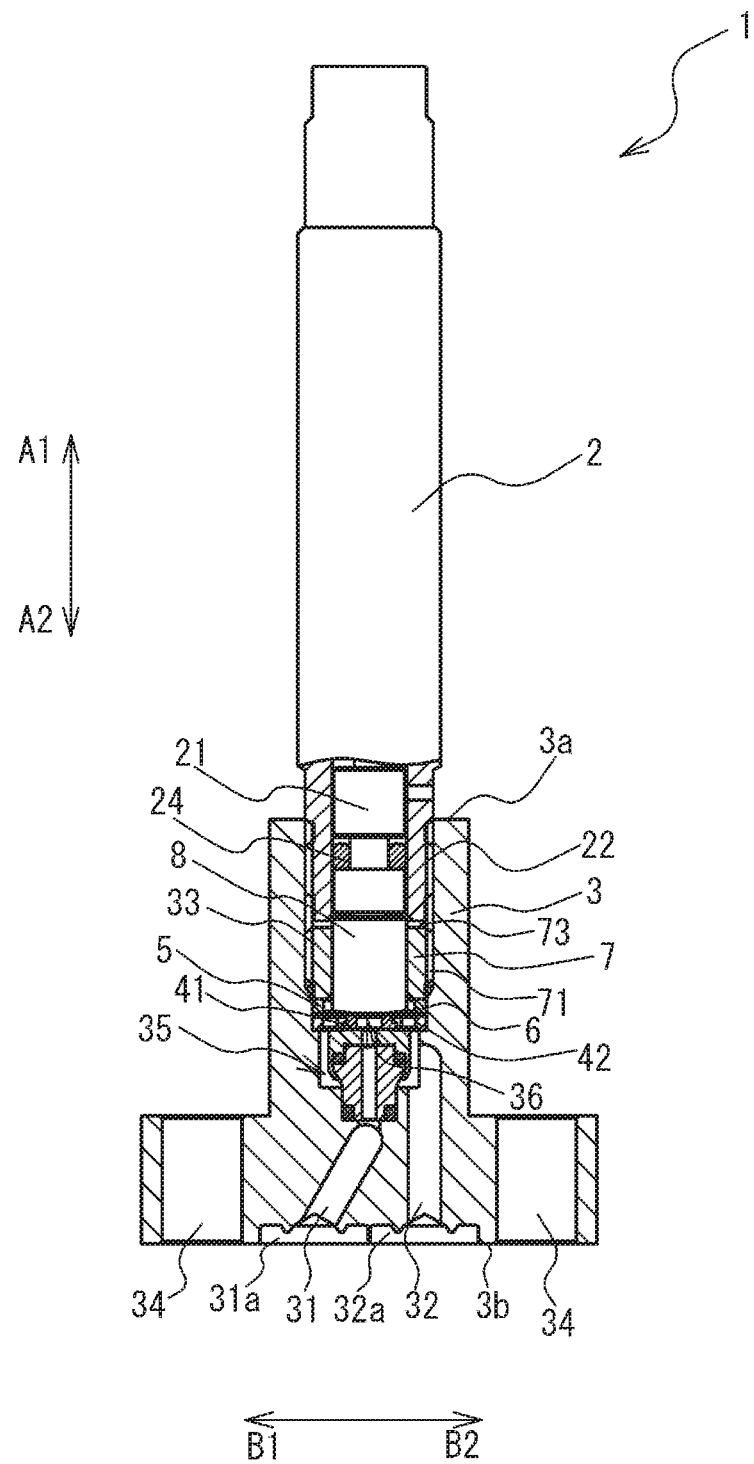

[fig.2]
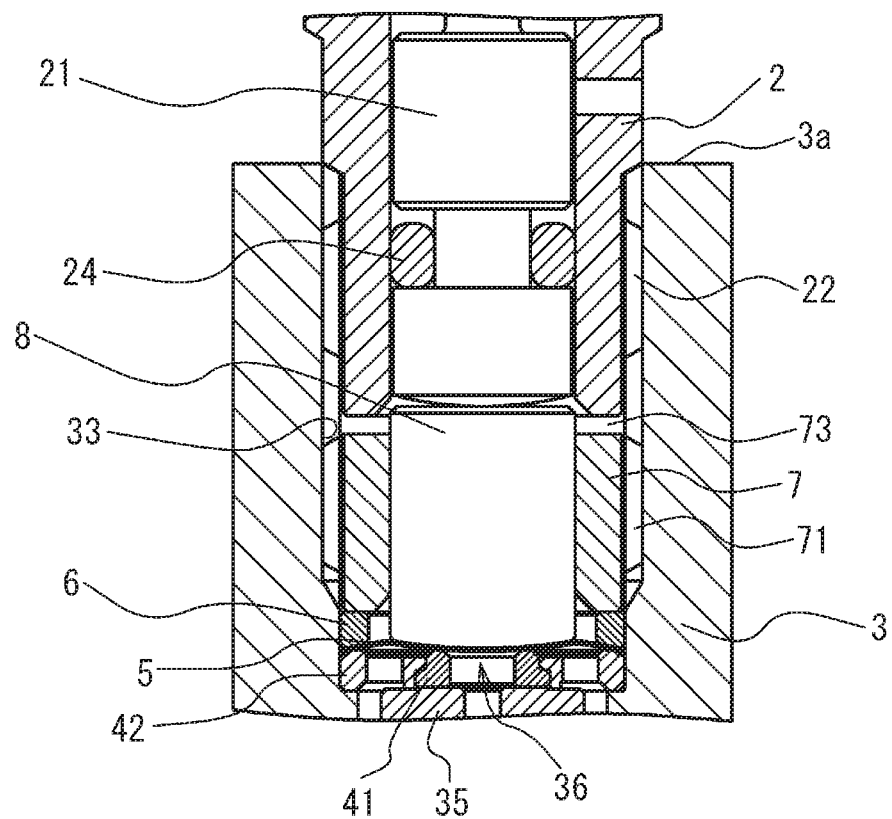
[fig.3]
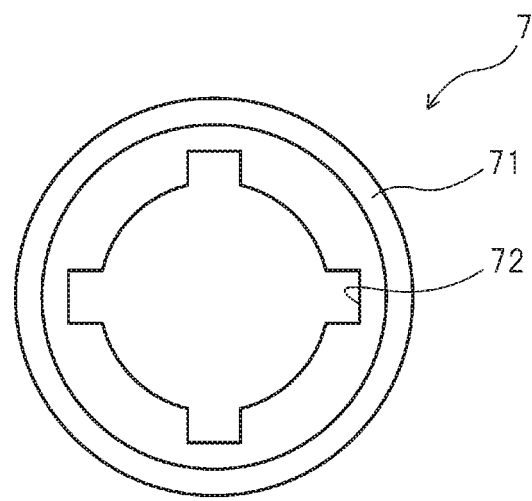

[fig.4]
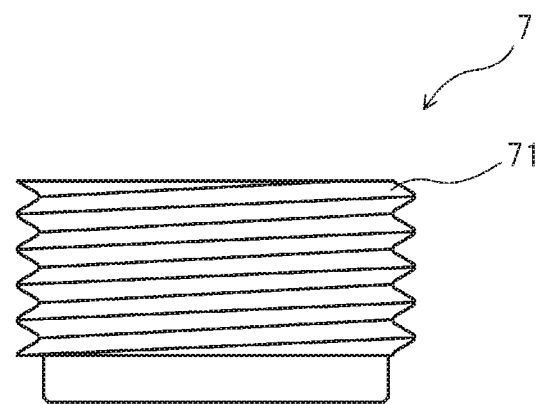

[fig.5]
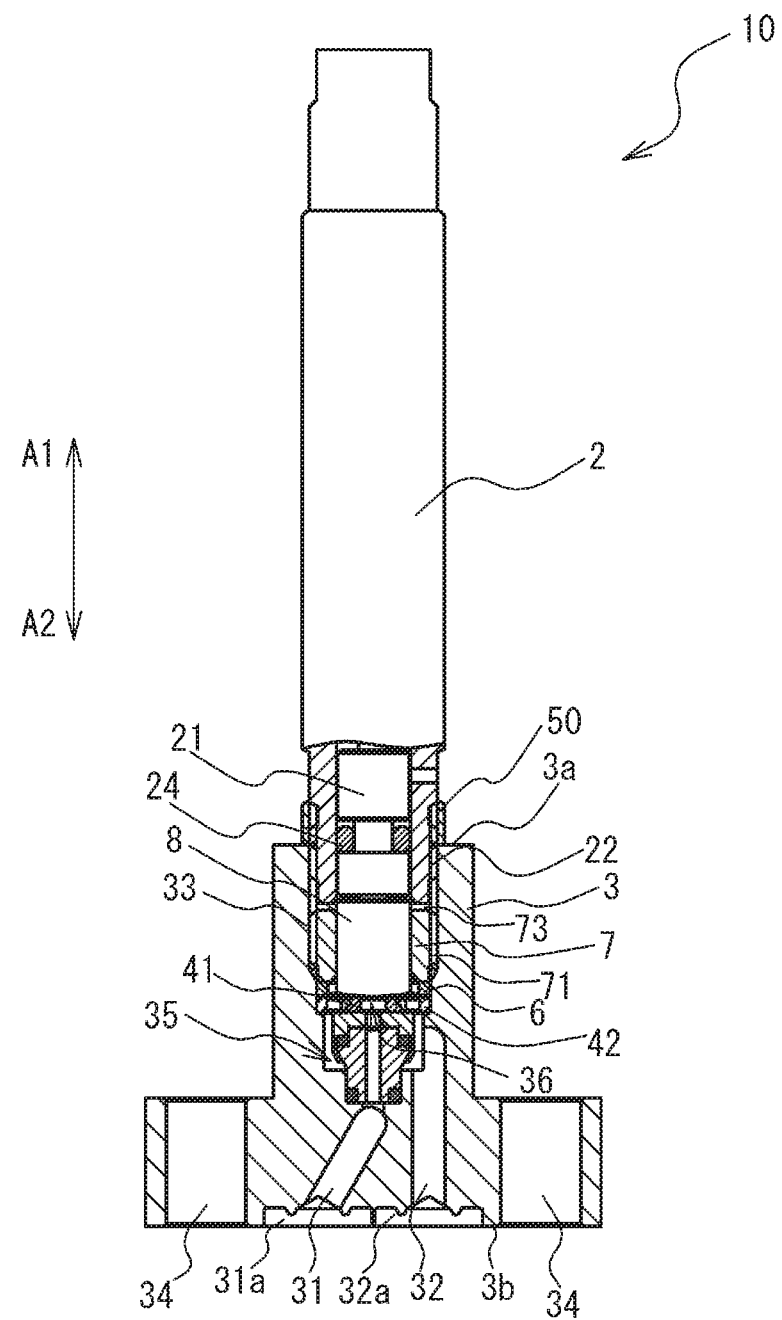

[fig.6]
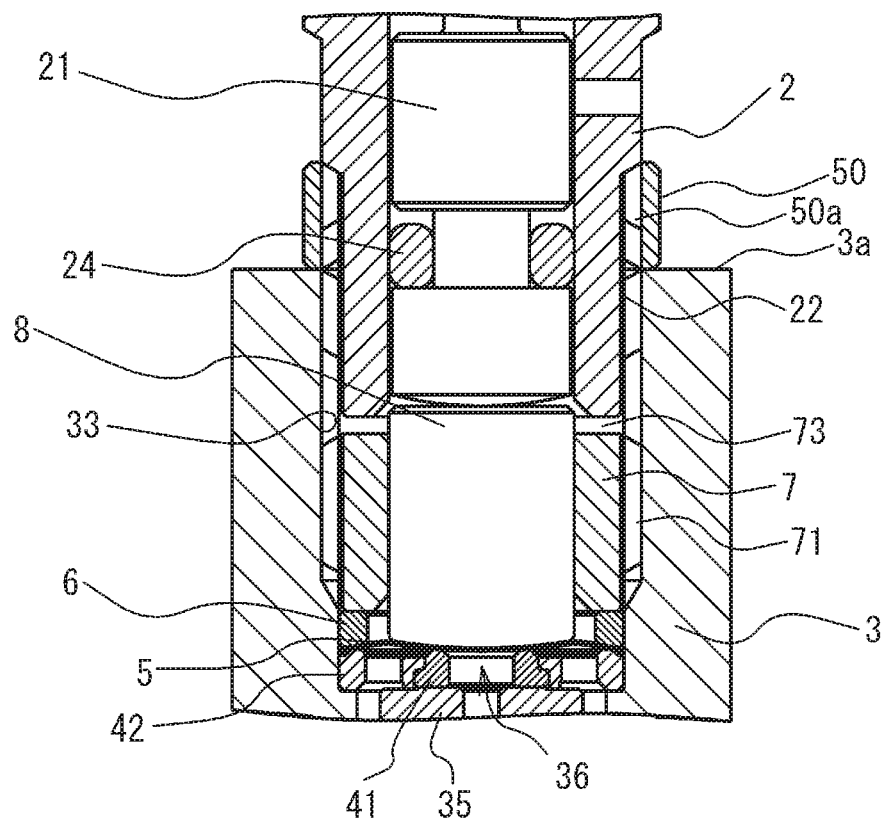
[fig.7]
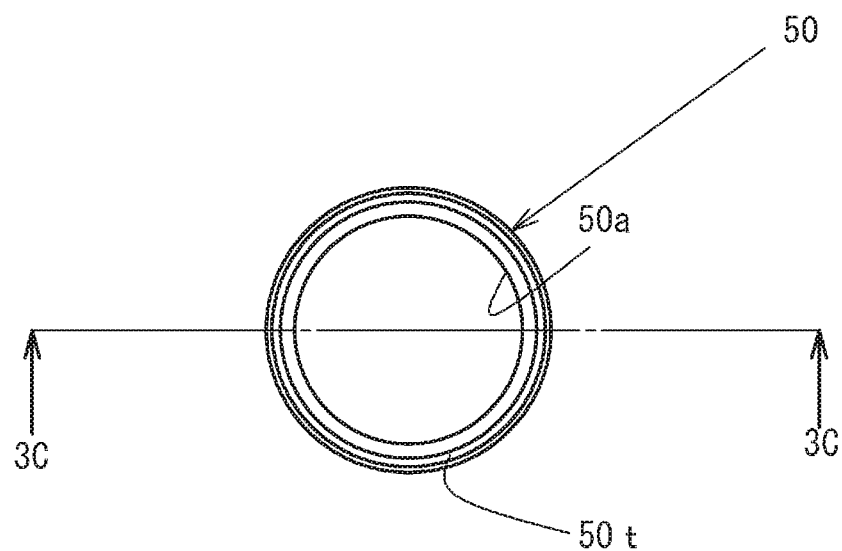

[fig.8]
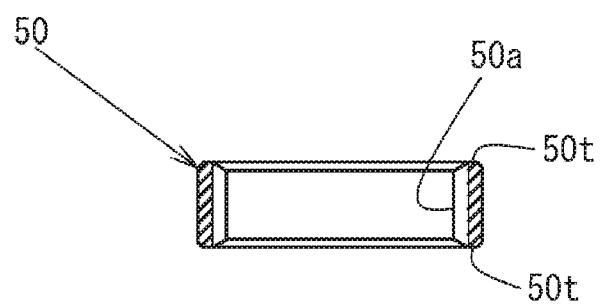

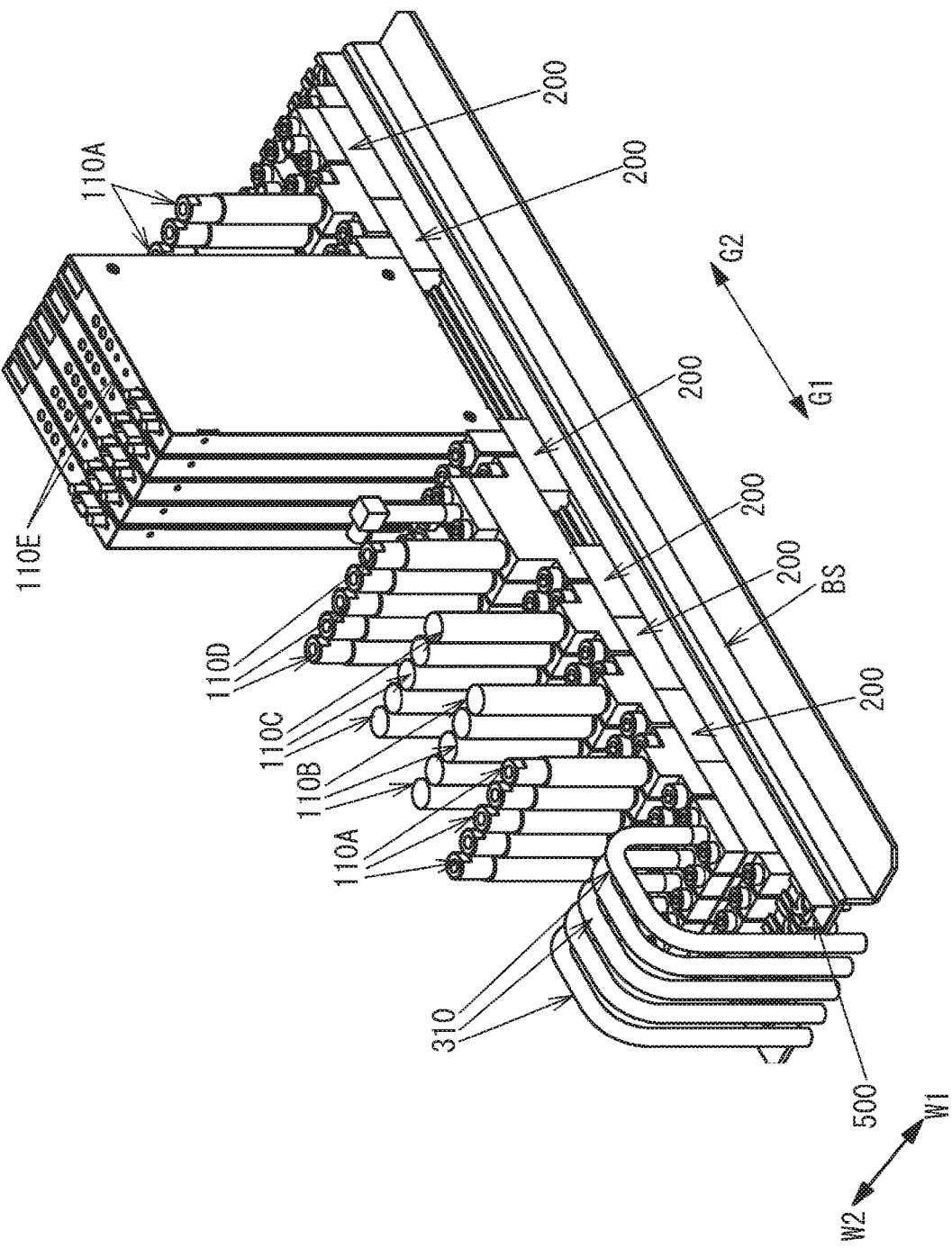
[fig.9]

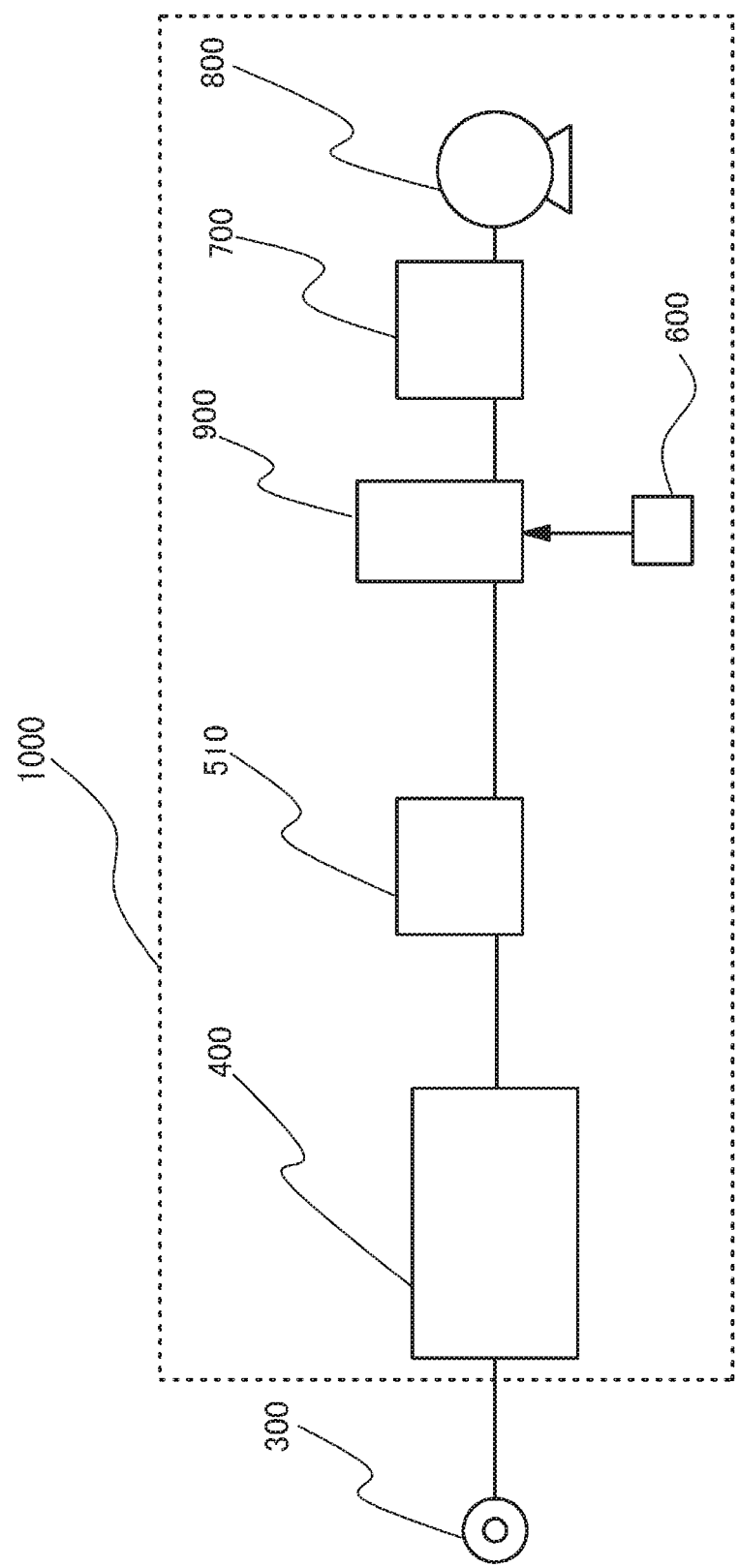

VALVE DEVICE AND FLUID CONTROL DEVICE

TECHNICAL FIELD

The present invention relates to a valve device and a fluid control device in which fluid devices including the valve device are integrated.

BACKGROUND ART

For example, as a fluid control device used for supplying various process gases to a chamber of a semiconductor manufacturing apparatus etc., the one disclosed in the following cited document 1 or the like is known.

PATENT LITERATURE

PTL 1: Japanese Laid-Open Application No. 2015-175502

SUMMARY OF INVENTION

Technical Problem

In the field of fluid control device as described above, high responsiveness of the supply control of the gas is required, and for this reason, it is required to proceed size-reduction and integration of a fluid control device as much as possible to install the fluid control device closer to the chamber or the like to which the fluid is supplied. Since there is only a limited space in the vicinity of the chamber or the like, a valve device used for the fluid control device is desired to reduce the dimensions of the block-shaped valve body and the outer diameter of the casing containing an actuator for operating a valve element to be installed on the valve body.

On the other hand, along with increase in the size of an object to be processed such as increase in the diameter of the semiconductor wafer, the supply flow rate of a fluid supplied from the fluid control device into the chamber must also be increased or maintained accordingly. In order to secure the flow rate, for the purpose of e.g. securing the lift amount of the valve element such as a diaphragm when opening and closing the valve, it is necessary to increase the length of the actuator in the operating direction of the valve element. Therefore, valve device has an elongated exterior in which the height of the casing enclosing the built-in actuator is larger compared to the size of the valve body.

In such an elongated valve device, it is difficult to ensure adequate strength against impacts of e.g. the contacts of nearby operators. However, a valve device that controls a fluid has to have a construction which prevents an impact from being transmitted to a valve element to affect open-close operation of the valve even when the valve device is subjected to physical impacts such as contacts or earthquakes.

The present disclosure has been made in view of the above-mentioned circumstances, and an object of the present disclosure is to provide a valve device and a fluid control device which realize size-reduction and in which influence of a physical impact on a valve element is further reduced.

Solution to Problem

The valve device of the present disclosure includes a valve seat disposed around an opening connected to a flow path formed in a valve body, a diaphragm for opening and closing the flow path by moving between a contact position and a non-contact position with respect to the valve seat, a presser adapter that contacts a peripheral portion of the diaphragm, a casing that incorporates an actuator for actuating the diaphragm and is fixed on the valve body by being screwed into a screw hole formed in the valve body, and an adapter fixing ring that is screwed into the screw hole and thereby fixed in the valve body while pressing the presser adapter and the diaphragm.

In the disclosed valve device, in the screw holes, the adaptor fixing ring and the casing may be arranged with a gap therebetween.

In the disclosed valve device, the adaptor fixing ring may have a threaded portion on the outside and a plurality of axially extending grooves on the inside.

In the disclosed valve device, the casing may include a protective member contacting an upper surface of the valve body.

The valve device of the present disclosure further includes a diaphragm presser that contacts a central portion of the diaphragm on a side opposite to the valve seat side of the diaphragm, and the length of the diaphragm presser in the extending direction of the screw hole may be longer than the length of the adapter fixing ring (7).

In the disclosed valve device, the outer dimension in one direction may be 10 millimeters or less.

The fluid control device of the present disclosure is a fluid control device in which a plurality of fluid devices are arranged from an upstream side to a downstream side, and the plurality of fluid devices include a valve device having any one of the above configurations.

The flow rate control method of the present disclosure is a flow rate control method for adjusting a flow rate of a fluid by using a valve device having any one of the above configurations.

The semiconductor manufacturing apparatus of the present disclosure is a semiconductor manufacturing apparatus that uses a valve device having any of the above configurations to control a process gas in a manufacturing process of a semiconductor device that requires a processing step using the process gas in a sealed chamber.

The semiconductor manufacturing method of the present disclosure is a semiconductor manufacturing method in which a valve device having any one of the above configurations is used for flow rate control of a process gas in a manufacturing process of a semiconductor device requiring a processing step using the process gas in a sealed chamber.

Advantageous Effects of Invention

According to the present disclosure, it is possible to provide a valve device and a fluid control device in which the effect on the valve body by a physical impact is further reduced.

BRIEF DESCRIPTION OF DRAWINGS

FIG. 1 is an overall view showing a cross section of a part of a valve device according to the present embodiment.

FIG. 2 is an enlarged sectional view showing the vicinity of the screw hole of the valve body.

FIG. 3 is a plan view of the adapter fixing ring.

FIG. 4 is a side view of the adapter fixing ring.

FIG. 5 is an overall view showing a cross section of a part of a valve device according to a modification of the present embodiment.

FIG. 6 is an enlarged sectional view showing the vicinity of the screw hole of the valve body of valve device.

FIG. 7 is a top view of the protective member.

FIG. 8 is a cross-sectional view of 3C-3C line in the protective member of FIG. 7.

FIG. 9 is a perspective view showing an exemplary fluid control device using the valve device of the present embodiment.

FIG. 10 is a schematic configuration diagram of a semiconductor manufacturing apparatus according to an embodiment of the present invention.

DESCRIPTION OF EMBODIMENTS

Embodiments of the present disclosure will be described below with reference to the drawings. In the description, the same elements are denoted by the same reference numerals, and repetitive descriptions are omitted as appropriate.

First, referring to FIG. 9, an exemplary fluid control device to which the present invention is applied will be described. FIG. 9 is a perspective view showing an exemplary fluid control device using the valve device of this embodiment. The fluid control device shown in FIG. 9 has a metallic base plate BS, on which there provided five rail members 500 each extending in the longitudinal direction G1, G2 and arranged along the width direction W1, W2.

Note that W1 represents the front side, W2 represents the back side. G1 represents the upstream side, and G2 represents the downstream side. Various fluid devices 110A to 110E are installed on each of the rail members 500 via a plurality of flow path blocks 200, and a flow path (not shown) through which a fluid flows from the upstream side to the downstream side is formed by the plurality of flow path blocks 200.

Here, a "fluid device" is a device used in a fluid control device for controlling a flow of a fluid, the fluid device comprises a body defining a fluid flow path and having at least two flow path ports opening at the surfaces of the body. Specific examples include, but are not limited to, an open-close valve (two-way valve) 110A, a regulator 110B, a pressure gauge 110C, an open-close valve (three-way valve) 110D, a mass flow controller 110E, and the like. The introduction pipe 310 is connected to an upstream flow path port of the flow path (not shown). In this fluid control device, five flow paths flowing in the G2 direction are formed in each of the five rail members 500, and the length of each flow path in the width direction W1, W2 may be 10 mm or less, that is, the width (dimension) of each fluid device may be 10 mm or less.

Although the present invention is applicable to various valve devices such as the above-described open-close valves 110A and 110D and the regulator 110B, an exemplifying application of the present invention to open-close valves will be described in the present embodiment.

FIG. 1 is an overall view showing a cross section of a part of a valve device 1 according to the present embodiment in. FIG. 2 is an enlarged sectional view showing the vicinity of the screw hole 33 of the valve body 3. As shown in FIGS. 1 and 2, the valve device 1 includes a casing 2, a valve body 3, a valve seat 41, an inner disk 42, a diaphragm 5, a presser adapter 6, an adapter fixing ring 7, and a diaphragm presser 8. It is assumed that arrows A1 and A2 in the drawing indicate the vertical direction, A1 indicates the upward direction, and A2 indicates the downward direction. Arrows B1 and B2 are longitudinal directions of the valve body 3 of valve device 1, and B1 indicates one end side and B2 indicates the other end side. The direction perpendicular to both arrows A1, A2 and arrows B1, B2 is the width direction.

The valve body 3 is formed in a block shape and defines a first flow path 31 and a second flow path 32 of gases which open at the bottom surface 3b. Concave holding portions 31a and 32a for holding a sealing member (not shown) are formed around the opening on the bottom surface 3b of the first flow path 31 and the second flow path 32. The first flow path 31 and the second flow path 32 communicate with each other in a valve chamber leading to an opening opposite to the bottom surface 3b.

The valve body 3 further has a screw hole 33 drilled from the upper surface 3a and communicates with the first flow path 31 and second flow path 32 through the valve chamber. In the present embodiment, the valve chamber has the orifice body 35 for adjusting the flow rate, but the valve chamber may not have the orifice body 35. The valve body 3 has two through holes 34 formed so as to sandwich the longitudinal screw holes 33. Into the through hole 34, fastening bolts for fixing the valve body 3 on flow path block 200 as shown in FIG. 9 are inserted.

The valve seat 41 is disposed around an opening 36 connected to a first flow path 31 formed in the valve body 3. In the present embodiment, it is arranged around an opening of the orifice body 35 connected to the first flow path 31, but in a configuration without the orifice body 35, it can be arranged around the opening 36 connected to the first flow path 31 such as the opening of the valve body 3. The valve seat 41 is formed of a resin such as PFA or PTFE so as to be elastically deformable.

The inner disk 42 is disposed around the valve seat 41 and has holes for passing the gas of the first flow path 31 and the gas of the second flow path 32, respectively.

The diaphragm 5 functions as a valve element by opening and closing the flow path by moving between a contact position and a non-contact position with respect to the valve seat 41. Further, the diaphragm 5 has a larger diameter than the valve seat 41, and is formed elastically deformable in a spherical shell shape with a metal such as stainless steel or a NiCo based alloy, or a fluorine-based resin.

The presser adapter 6 contacts the peripheral portion of the diaphragm 5 and sandwiches the diaphragm 5 between the presser adapter and the inner disk 42.

Adapter fixing ring 7 presses the presser adapter 6 and the diaphragm 5 by being screwed into the screw hole 33 formed in the valve body 3, and is fixed in the valve body 3. Thus, the diaphragm 5, is pressed toward the valve body 3 by the lower end surface of the adapter fixing ring 7 via the presser adapter 6, and is thereby supported by the valve body 3 so as to be able to contact or separate from the valve seat 41. FIG. 3 is a plan view of the adapter fixing ring 7. FIG. 4 is a side view of the adapter fixing ring 7. As shown in these figures, the adapter fixing ring 7 has a ring screw portion 71 on the outside, and has a plurality of grooves 72 extending axially on the inside. The grooves 72 is configured to engage with the tool for rotating the adapter fixing ring 7 when attaching or removing the adapter fixing ring 7 to or from the screw hole 33. Thus, the adapter fixing ring 7 can more reliably fix the presser adapter 6 and the diaphragm 5 with respect to the valve body 3. Incidentally, the adapter fixing ring 7 may be formed of a metal, and may be formed of the same material as the valve body 3 or a material having a thermal expansion coefficient close to that of the valve body 3.

Casing 2 incorporates an actuator for actuating the diaphragm 5, is screwed into the screw hole 33 and is thereby fixed on the valve body 3. Casing 2 is cylindrical as a whole and incorporates an actuator (not shown) therein. The actuator may be, for example, a piston or the like driven by compressed air, but is not limited thereto, and various actuators may be employed, such as a manual, piezoelectric actuator, a solenoid actuator, or the like. The casing 2 incorporating the actuator may constitute a part of the actuator or may be a member separate from the actuator. As shown in FIG. 2, on the outer periphery of the portion of the casing 2 connected to the valve body 3, the casing screw portion 22 is formed, that is screwed with the screw hole 33 of the valve body 3, and the portion is connected to the valve body 3. At this time, the valve body 3 can be disposed with a gap 73 so as not to contact with the adapter fixing ring 7 which is screwed into the screw hole 33 first.

Diaphragm presser 8 contacts from above the central portion of the diaphragm 5 on the side opposite to the valve seat 41 side of the diaphragm 5. Diaphragm presser 8 is connected to the actuator in the casing 2 and moves in accordance with the operation of the actuator. Here, the length of the diaphragm presser 8 in the extending direction of the screw hole 33 can be longer than the length of the adapter fixing ring 7, so that the operation of the actuator in the casing 2 can be transmitted to the diaphragm 5 even when there is the adapter fixing ring 7.

The portion of the casing 2 connected to the valve body 3 is cylindrical, has and encloses a stem 21 which is driven in the vertical direction A1, A2 by an actuator incorporated in the casing 2. An O-ring 24 is provided between the stem 21 and the portion of the casing 2 connected to the valve body 3, and seals between the valve chamber side and the actuator side. The stem 21 has a lower end formed in a hemispherical shape that is connected to diaphragm presser 8, and when the diaphragm presser 8 is driven in the downward direction A2, the diaphragm 5 is pressed by the diaphragm presser 8.

In FIG. 2, the diaphragm 5 is pressed by diaphragm presser 8, elastically deformed and is in a condition of being pressed against the valve seat 41. When releasing the pressing by diaphragm presser 8, it restores to a spherical shell shape. With the diaphragm 5 pressed against the valve seat 41, the first flow path 31 is closed and when diaphragm presser 8 moves upwards A1, the diaphragm 5 moves away from the valve seat 41 and the first flow path 31 is opened and communicates with the second flow path 32.

Although the lower direction A2 side of the stem 21 is formed in a hemispherical shape, the construction may be such that the upper direction A1 side of diaphragm presser 8 is formed in a hemispherical shape and the lower direction A2 side of stem 21 is formed in a plane.

As described above, since the casing 2 and the adapter fixing ring 7 are formed as separate members, even when a physical shock to the casing 2 occurs, the effect transmitted to the adapter fixing ring 7 can be suppressed, and it is possible to suppress the effect on the opening and closing of flow path. Thus, it is possible to realize a valve device 1 in which the effect of physical shock on the valve element is further reduced. Further, in the screw hole 33, since the adapter fixing ring 7 and the casing 2 are arranged with a gap 73 to each other, even when a physical shock to the casing 2 occurs, the influence transmitted to the adapter fixing ring 7 can be further reduced. Thus, it is possible to further suppress the effect on the opening and closing of flow path, and it is possible to realize a valve device 1 in which the effect of physical shock on the valve element is further reduced. Further, since the stem 21 and diaphragm presser 8 are connected by point contacts, even when a physical impact occurs in the casing 2, it is possible to further reduce the effect on diaphragm presser 8, the adapter fixing ring 7, and further the diaphragm 5. In addition, the above-described valve device 1 can be applied to a valve device 1 having the width-wise dimension of 10 mm or less. Thus, even if the valve device 1 has a shape in which the ratio between the width and the height in one direction of is large, so that the impact occurred to the casing 2 becomes a large moment and transmitted to the valve body 3, since it is possible to suppress the effect on the open-close portions of the flow path, it is possible to realize valve device 1 in which the effect of physical impact on the valve body is further reduced.

FIG. 5 is an overall view showing a cross section of a part of valve device 10 according to a modification of the present embodiment. FIG. 6 is an enlarged sectional view showing the vicinity of the screw hole 33 of the valve body 3 of valve device 10. In valve device 10 of this modification is the same as the above-described valve device 1 except that the casing 2 further has a protective member 50 in contact with the upper surface 3a of the valve body 3, overlapping descriptions will be omitted.

As shown in these figures, the protective member 50 is screwed into the upper portion of the casing screw portion 22, and in this state, the casing screw portion 22 is screwed into the screw hole 33 of the valve body 3, so that the protective member 50 contacts the upper surface 3a of the valve body 3. In the present modification, the protective member 50 is formed as a separate body from the casing 2 and screwed with the casing screw portion 22 to be integrated with the casing 2, but the protective member 50 may be integrally formed with the casing 2. Here, although not shown, the width direction length of the casing 2 and the protective member 50 can be equal to or less than the width direction length of the valve body 3.

In a state where the protective member 50 is not provided in the casing screw portion 22, when the casing 2 is subjected to physical impact and a bending moment, at the open end of the screw hole 33 of the valve body 3, stress concentrates between the casing 2 and the valve body 3. In particular, when the width direction length of the casing 2 and the valve body 3 is small and the height of the casing 2 is relatively large, there is also a possibility that a part of the valve body 3 is damaged depending on the stress concentration. In the present modification, by receiving the bending moment generated in the casing 2 by the protective member 50 on the upper surface 3a of the valve body 3, it is possible to disperse the stresses.

Further, when employing a double nut structure, it is possible to finely adjust the position of the casing 2 screwed into the valve body 3. Since this fine adjustment can change the displacement amount of the diaphragm when the valve is opened, it is possible to assemble while finely adjusting the flow rate of the gas when the valve is opened.

FIG. 7 is a top view of the protective member 50. FIG. 8 is a cross-sectional view of the protective member of FIG. 7 taken along a 3C-3C line. As shown in FIGS. 7 and 8, the protective member 50 is made of a metal annular member, and has a vertically symmetrical shape. On the inner periphery of the protective member 50, a protective member screw portion 50a for screwing with the casing screw portion 22 is formed. Further, both end surfaces of the protective member 50 are abutting end surfaces 50t that are flat surfaces, as described later, one of the abutting end surfaces 50t is capable of abutting on the upper surface 3a of the valve body 3. Since each abutting end surface 50t is constituted by a plane, the entire surface of the abutting end surface 50t can be abutted on the upper surface 3a of the valve body 3. The protective member 50 has a side surface on which a round hole (not shown) is drilled, and it can be turned using a hook pin wrench.

In the protective member 50 shown in FIGS. 7 and 8, chamfers are formed at circumferential edges of the end faces, but in order to increase the area of the abutting end surface 50t and abutting area to the upper surface 3a, the size of the chamfers is preferably small.

In the present embodiment, the protective member 50 has a circular annular shape, but the outer shape is not limited to a circular shape as long as it is an annular shape. However, it is desirable that the outer contour of the protective member 50 falls within the upper surface 3a of the valve body 3.

Further, although the configuration of fixing the protective member 50 by screwing is employed, it is also possible to employ other alternative means such as caulking or welding.

In the above-described embodiment, a fluid control device comprising a plurality of flow path blocks 200 each having a valve device mounted thereon is exemplified, but the present valve device can be applied to an integral flow path block or a flow path plate in addition to the divided flow path block 200.

In the above embodiment, a valve device that is automatically opened and closed by an actuator by compressed air or the like is exemplified as the valve device of the present invention, but the present invention is not limited to this, and the present invention is also applicable to a manual valve.

Next, referring to FIG. 10, an application of the above-described fluid control device will be described.

Semiconductor manufacturing apparatus 1000 shown in FIG. 10 is a device for performing a semiconductor manufacturing process by an ALD method, where 300 denotes a process gas supply source, 400 denotes a gas box, 510 denotes a tank, 600 denotes a control unit, 700 denotes a process chamber, 800 denotes an exhaust pump, and 900 denotes an open-close valve.

In the semiconductor manufacturing process by the ALD method, it is necessary to precisely adjust the flow rate of the processing gas, an along with increase of the diameter of the substrate, it is also necessary to secure a certain amount of flow rate of the processing gas.

Gas box 400 incorporates the above fluid control device in which various fluid devices such as open-close valves, regulators, and mass flow controllers are integrated and accommodated in the box, in order to supply the process gas accurately metered to the processing chamber 700.

The tank 510 functions as a buffer for temporarily storing the processing gas supplied from the gas box 400.

Open-close valve 900 controls the flow rate of the metered gas in the gas box 400.

Control unit 600 executes the flow control by controlling open-close valve 900.

The processing chamber 700 provides a sealed processing space for depositing a film on a substrate by an ALD method.

The exhaust pump 800 evacuates within the processing chamber 700.

In the above application example, fluid control device 1 is used in a semiconductor manufacturing process by the ALD method, but the present invention is not limited to this, and the present invention can be applied to any object requiring precise flow rate control, such as an atomic layer etch (ALE: Atomic Layer Etching) method.

REFERENCE SIGNS LIST 1, 10: Valve device
2: Casing
3: Valve body
3a: Upper surface
3b: Bottom surface
5: Diaphragm
6: Presser adapter
7: Adapter fixing ring
8: Diaphragm presser
21: Stem
22: Casing screw portion
24: O-ring
31: First flow path
31a: Holding portion
32: Second flow path
33: Screw hole
34: Through hole
35: Orifice body
36: Opening
41: Valve seat
42: Inner disk
50: Protective member
50a: Protective member screw portion
50t: Abutting end surface
71: Ring screw portion
72: Groove
73: Gap
110A: Open-close valve
110B: Regulator
110C: Pressure gauge
110D: Open-close valve
110E: Mass flow controller
200: Flow path block
310: Introduction pipe
400: Gas box
500: Rail member
510: Tank
600: Control unit
700: Processing chamber
800: Exhaust pump
900: Open-close valve
1000: Semiconductor manufacturing apparatus
A1: Upward direction
A2: Downward direction
B1, B2: Longitudinal direction
BS: Base plate
G1: Longitudinal direction (upstream)
G2: Longitudinal direction (downstream)
W1, W2: Width direction

The invention claimed is:
1. A valve device comprising:
a valve seat disposed around an opening connected to a flow path formed in a valve body,
a diaphragm for opening and closing the flow path by moving between a contact position and a non-contact position with respect to the valve seat,
a presser adapter that contacts a peripheral portion of the diaphragm,
a casing that incorporates an actuator for actuating the diaphragm and is fixed on the valve body by being screwed into a screw hole formed in the valve body, and
an adapter fixing ring that is screwed into the screw hole and thereby fixed in the valve body while pressing the presser adapter and the diaphragm,
wherein the adaptor fixing ring and the casing are arranged with a gap therebetween, and wherein the adapter fixing ring and the casing are positioned directly adjacent to each other in an extending direction of the screw hole.

2. The valve device according to claim 1, wherein the adapter fixing ring has a screw portion on an outside and has a plurality of grooves extending axially on an inside.

3. The valve device according to claim 1, wherein the casing has a protective member contacting an upper surface of the valve body.

4. The valve device according to claim 1, further comprising a diaphragm presser that contacts a central portion of the diaphragm on a side opposite to a valve seat side of the diaphragm,
    wherein a length of the diaphragm presser in the extending direction of the screw hole is longer than a length of the adaptor fixing ring.

5. The valve device according to claim 1, wherein a dimension of the valve body in one direction is 10 millimeters or less.

6. A fluid control device in which a plurality of fluid devices are arranged from an upstream side toward a downstream side,
    wherein the plurality of fluid devices includes the valve device as defined in claim 1.

7. A flow rate control method for adjusting a flow rate of a fluid, comprising using the valve device as defined in claim 1.

\* \* \* \* \*